United States Patent
Shimamura et al.

(10) Patent No.: US 9,441,153 B2
(45) Date of Patent: Sep. 13, 2016

(54) UV PHOTOEXCITED RED LIGHT-EMITTING MATERIAL AND LIGHT EMITTING APPARATUS

(71) Applicant: NATIONAL INSTITUTE FOR MATERIALS SCIENCE, Ibaraki (JP)

(72) Inventors: Kiyoshi Shimamura, Ibaraki (JP); Encarnacion Antonia Garcia Villora, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 148 days.

(21) Appl. No.: 14/369,465

(22) PCT Filed: Apr. 25, 2013

(86) PCT No.: PCT/JP2013/062280
§ 371 (c)(1),
(2) Date: Jun. 27, 2014

(87) PCT Pub. No.: WO2013/164978
PCT Pub. Date: Nov. 7, 2013

(65) Prior Publication Data
US 2014/0361328 A1 Dec. 11, 2014

(30) Foreign Application Priority Data
May 1, 2012 (JP) ................................ 2012-104954

(51) Int. Cl.
*C09K 11/77* (2006.01)
*H01L 33/50* (2010.01)
(Continued)

(52) U.S. Cl.
CPC ........ *C09K 11/7733* (2013.01); *C09K 11/7774* (2013.01); *C30B 11/00* (2013.01);
(Continued)

(58) Field of Classification Search
CPC .......... C09K 11/7733; C09K 11/7774; C09K 11/7705; C09K 11/7748; C09K 11/7757; C09K 11/7763; C09K 11/772; C09K 11/7773; C09K 11/7791; C09K 11/77; C09K 11/7734; C09K 11/7772; C30B 11/00; C30B 15/00; C30B 29/12; H01L 33/502; H01L 33/504; H01L 33/50; H01L 33/505; H01L 2924/01021
USPC ..................... 252/301.4 H, 301.4 F, 301.4 R; 313/502–504
See application file for complete search history.

(56) References Cited

U.S. PATENT DOCUMENTS

| 3,667,921 A * | 6/1972 | Grodkiewicz et al. .............. C09K 11/7704 117/76 |
| 2007/0205712 A1* | 9/2007 | Radkov ............ C09K 11/0838 313/503 |
| 2008/0025896 A1 | 1/2008 | Chi et al. |

FOREIGN PATENT DOCUMENTS

| JP | 2004-115621 | 4/2004 | |
| JP | EP 1462824 A1 * | 9/2004 | ........... C09K 11/773 |

(Continued)

OTHER PUBLICATIONS

Wang et al. "Synthesis and luminescence behavior of Eu3+-doped CaF2 nanoparticles", 2005, Solid State Communications, 133, pp. 775-779.*

(Continued)

*Primary Examiner* — Matthew E Hoban
*Assistant Examiner* — Lynne Edmondson
(74) *Attorney, Agent, or Firm* — Wenderoth, Lind & Ponack, L.L.P.

(57) ABSTRACT

A UV photoexcited red light-emitting material comprising a fluoride single crystal represented by the chemical formula: $M_{1-x}RE_xF_{2+x-w}$, wherein M is at least one metal element belonging to Group 2 of the Periodic Table selected from the group consisting of Be, Mg, Ca, Sr, and Ba, RE is a rare earth element, and the relationships: $0<x\leq 0.4$ and $0\leq w\leq 0.5$ are satisfied.

8 Claims, 14 Drawing Sheets

(51) Int. Cl.
    *C30B 11/00*     (2006.01)
    *C30B 15/00*     (2006.01)
    *C30B 29/12*     (2006.01)
(52) U.S. Cl.
    CPC .............. *C30B 15/00* (2013.01); *C30B 29/12*
            (2013.01); *H01L 33/504* (2013.01); *H01L
            33/502* (2013.01); *H01L 2224/13* (2013.01);
            *H01L 2224/48091* (2013.01); *H01L
            2224/49107* (2013.01)

(56)    References Cited

FOREIGN PATENT DOCUMENTS

| JP | 2006-36618 | 2/2006 |
| JP | 2006-206359 | 8/2006 |
| JP | 2010-155891 | 7/2010 |

OTHER PUBLICATIONS

Shimamura et al., "New red phosphor: Ca0.65Eu0.35F2.35 single crystal", 2004, Functional Materials 11, No. 4, pp. 676-679.*
Kirm et al., "VUV Spectroscopy of a Ca0.65Eu0.35F2.35 single crystal", 2005, Institute of Physics, pp. 569-570.*
Gotlib et al., "Molecular Dynamics Simulations of Ba1-xGdxF2+x Solid Solutions over a Wide Temperature Range: II. Structural Characteristics and Fluoride Ion Diffusion", 2003, Inorganic Materials, vol. 39, No. 3, pp. 358-367.*
Blasse, "Scintillator Materials", 1994, Chem. Mater. 6, pp. 1465-1475.*
International Search Report issued Aug. 6, 2013 in corresponding International Application No. PCT/JP2013/062280.
"About High-luminance LED Materials", published by Nikkan Kogyo Shimbun Ltd., pp. 44-45, 2005 (with partial English translation).
S. Ye et al., "Phosphors in phosphor-converted white light-emitting diodes: Recent advances in materials, techniques and properties", Materials Science and Engineering R, vol. 71, Issue 1, Dec. 2010, pp. 1-34.
C. Lorbeer et al., "Highly doped alkaline earth nanofluorides synthesized from ionic liquids", Optical Materials, Dec. 2011, pp. 336-340.
Feng Wang et al., "Synthesis and luminescence behavior of $Eu^{3+}$-doped $CaF_2$ nanoparticles", Solid State Communications, 2005, pp. 775-779.

* cited by examiner (a)

(b)

(a)

(b)

UV PHOTOEXCITED RED LIGHT-EMITTING MATERIAL AND LIGHT EMITTING APPARATUS

TECHNICAL FIELD

The present invention relates to a UV photoexcited red light-emitting material and a light emitting apparatus.

BACKGROUND ART

In recent years, as the demand for an LED (Light Emitting Diode) applied to lighting is increasing, the development of LED having higher luminance is proceeding.

A high-luminance LED emits a light with high intensity, and further emits a large quantity of heat due to a large current flowing the LED. Therefore, the members constituting the LED are exposed to a light with high intensity and placed under high temperature conditions for a long term. For this reason, the members constituting the LED are required to individually have high light resistance and high heat resistance.

There are generally representative white light emitting apparatuses (hereinafter, frequently referred to as "white LEDs") of the following three types (Non-Patent Literature 1).

The white LED of the first type has only the light emitting devices in the one package therefor and does not need a binder, such as an epoxy resin, and therefore can achieve high light resistance and high heat resistance. The white LED of the first type, however, has a problem in that it is difficult to control the luminances and color tones of the light emitting devices of three colors, so that the construction of the circuit for the control is inevitably complicated, increasing the cost for production of the LED.

A white LED of the second type has in one package for the LED an ultraviolet (hereinafter, frequently referred to as "UV") light emitting device and a binder, such as an epoxy resin, covering the ultraviolet light emitting device, wherein the binder has dispersed therein an ultraviolet photoexcited red fluorescent substance, an ultraviolet photoexcited green fluorescent substance, and an ultraviolet photoexcited blue fluorescent substance.

A white LED of the third type has in one package for the LED a blue light emitting device and a binder, such as an epoxy resin, covering the blue light emitting device, wherein the binder has dispersed therein a blue-photoexcited red fluorescent substance and a blue-photoexcited green fluorescent substance.

In each of the white LEDs of the second and third types, only one light emitting device is used in the one package. Therefore, in the white LEDs of the second and third types, the luminance and color tone are easily controlled, as compared to those in the white LED of the first type, and hence the circuit for the control can be simplified. Thus, the white LEDs of the second and third types have an advantage in that the cost for production of the LED can be reduced. Further, the white LEDs of the second and third types also have an advantage in that it is possible to increase the width in which the color temperature is controlled.

However, both the white LEDs of the second and third types use a binder, and therefore pose a problem in that the binder is exposed to a light with high intensity and placed under high temperature conditions for a long term and hence is likely to deteriorate, so that the binder suffers discoloration to lower the light transmittance, reducing the light emission efficiency.

Moreover, when a large current flows through the light emitting device to cause light emission with high luminance, not only the deterioration of the binder but also a lowering of the properties of the fluorescent substances may occur Non-Patent Literature 2).

The white LED is not limited to one having the above-mentioned construction using the lights of three colors, but may have a construction using lights of two colors having the relationship of complementary colors and passing through the CIE chromaticity coordinates (0.33, 0.33) for a white light. For example, there is a white LED having in one package for the LED a combination of a blue light emitting device and a blue-photoexcited yellow fluorescent substance in a particulate form dispersed in a binder, such as an epoxy resin (Patent Literature 1). However, the white LED having such a construction using the lights of two colors still has a problem of the lowering of the light emission efficiency due to the deterioration of the binder.

For solving the problem of the deterioration of the binder, an attempt to use a silicone resin as a binder instead of the epoxy resin has been made. However, the problem has not completely been solved.

CITATION LIST

Patent Literature 1: JP-A-2010-155891
Non-Patent Literature 1: "About High-luminance LED Materials", published by Nikkan Kogyo Shimbun Ltd., p 44 (2005)
Non-Patent Literature 2: Materials Science and Engineering R, 71(2010) 1-34

SUMMARY OF INVENTION

Technical Problem

A task of the present invention is to provide a UV photoexcited red light-emitting material which can stably emit a red light at high efficiency even when a large current flows through a UV light emitting device to cause the material to emit a light with high luminance, and a light emitting apparatus which can emit a red light or white light with high luminance at high efficiency for a long term.

Solution to Problem

The present inventors have made various experiments and, as a result, have developed a novel single crystal of fluoride represented by $Ba_{1-x}Eu_xF_{2+x}$ (hereinafter, frequently referred to as "BaEuF"). This single crystal can stably emit a red light with high luminance using a UV light as a light for excitation. The present inventors have confirmed that, by using the single crystal and a UV light emitting device in combination, a light emitting apparatus using no binder can be provided. They have confirmed that the light emitting apparatus is advantageous not only in that the light emitting apparatus can emit a red light or white light with high luminance at high efficiency, but also in that the circuit for the light emitting apparatus can be simplified, reducing the cost for production of the apparatus. The present invention has been completed, based on the above finding.

(1) The UV photoexcited red light-emitting material of the invention comprises a fluoride single crystal represented by the chemical formula: $M_{1-x}RE_xF_{2+x-w}$, wherein M is at least one metal element belonging to Group 2 of the Periodic Table selected from the group consisting of Be, Mg, Ca, Sr, and Ba, RE is a rare earth element, and the relationships: $0<x\leq0.4$ and $0\leq w\leq0.5$ are satisfied.

(2) In the UV photoexcited red light-emitting material of the invention, it is preferred that M is Ba and RE is Eu.

(3) In the UV photoexcited red light-emitting material of the invention, it is preferred that the relationship: $0.05\leq x\leq0.3$ is satisfied.

(4) In the UV photoexcited red light-emitting material of the invention, it is preferred that a part of M is substituted with at least one element selected from the group consisting of metal elements belonging to Groups 3, 4, 5, 13, and 14 of the Periodic Table.

(5) In the UV photoexcited red light-emitting material of the invention, it is preferred that a part of RE is substituted with at least one element selected from the group consisting of Sc, Y, and rare earth elements.

(6) In the UV photoexcited red light-emitting material of the invention, it is preferred that a part of F is substituted with at least one element selected from the group consisting of Cl, Br, and I.

(7) The light emitting apparatus of the invention has a plate member comprising the UV photoexcited red light-emitting material according to any one of the above items, and a UV light emitting device having a light emission surface, wherein the UV photoexcited red light-emitting material is arranged with respect to the UV light emitting device so that one surface of the plate member is opposite to the light emission surface of the UV light emitting device.

(8) In the light emitting apparatus of the invention, it is preferred that the UV light emitting device has a light emission peak wavelength in the range of from 250 to 425 nm.

(9) In the light emitting apparatus of the invention, it is preferred that the UV photoexcited red light-emitting material is arranged in contact with the light emission surface of the UV light emitting device.

(10) In the light emitting apparatus of the invention, it is preferred that the UV photoexcited red light-emitting material is arranged apart from the light emission surface of the UV light emitting device.

(11) In the light emitting apparatus of the invention, it is preferred that a UV photoexcited yellow light-emitting material is arranged in contact with the UV photoexcited red light-emitting material, and the UV photoexcited blue light-emitting material is arranged in contact with a UV photoexcited yellow light-emitting material.

(12) In the light emitting apparatus of the invention, it is preferred that the UV photoexcited blue light-emitting material is a Ce:$R_2SiO_5$ (wherein R is at least one of Lu, Y, and Gd) single crystal.

(13) In the light emitting apparatus of the invention, it is preferred that the UV photoexcited yellow light-emitting material is a cerium-added terbium-scandium-aluminum garnet-type single crystal.

Effects of Invention

The UV photoexcited red light-emitting material of the invention can stably emit a red light at high efficiency even when a large current flows through the UV light emitting device to cause the material to emit a light with high luminance due to UV photoexcitation.

In the light emitting apparatus of the invention, the light emitted from a UV light emitting device excites the UV photoexcited red light-emitting material to cause light emission, and the light emitting apparatus uses no binder and can emit a red light with high luminance at high efficiency for a long term. Therefore, the circuit for the light emitting apparatus can be simplified, reducing the cost for production of the apparatus.

Further, in the light emitting apparatus of the invention, the light emitted from a UV light emitting device excites not only the UV photoexcited red light-emitting material but also the UV photoexcited yellow light-emitting material and UV photoexcited blue light-emitting material to cause light emission, and the light emitting apparatus uses no binder and can emit a white light with high luminance at high efficiency for a long term. Therefore, the circuit for the light emitting apparatus can be simplified, reducing the cost for production of the apparatus.

DESCRIPTION OF EMBODIMENTS

Figure 1:
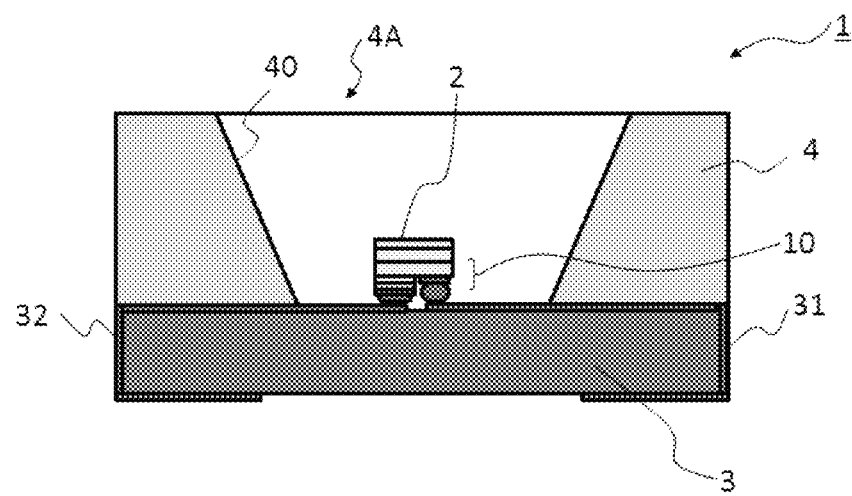
FIG. 1 shows diagrammatic views of the light emitting apparatus according to the first embodiment of the invention, wherein (a) is a cross-sectional view of the light emitting apparatus, and (b) is a cross-sectional view of a light emitting device constituting the light emitting apparatus and the portions around the light emitting device.
Figure 1:
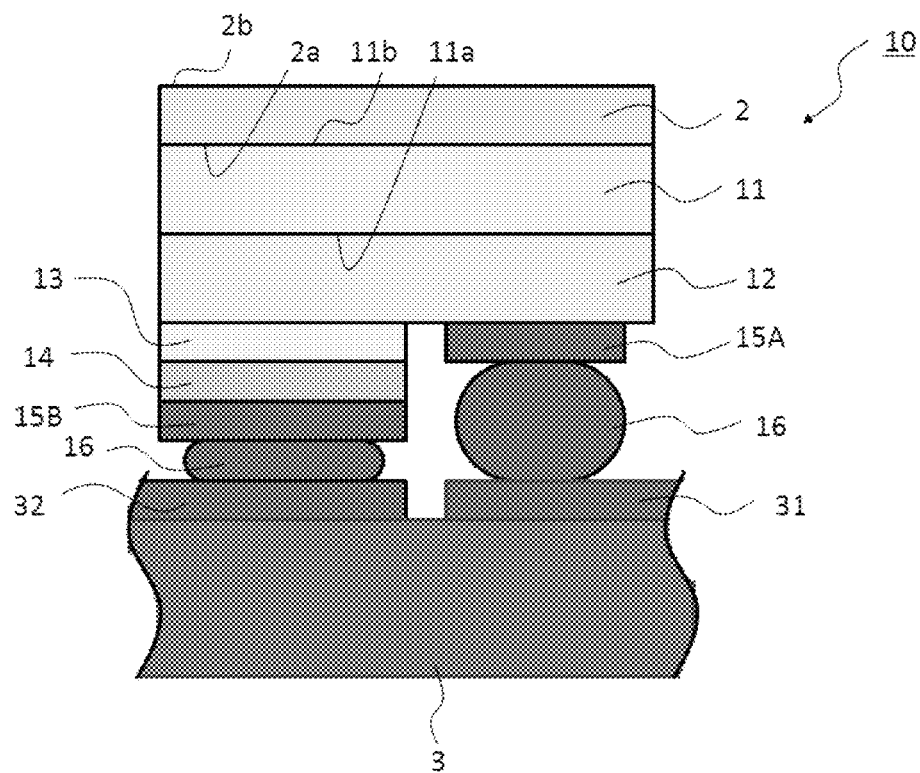

First Embodiment
<UV Photoexcited Red Light-Emitting Material>

The UV photoexcited red light-emitting material comprises a fluoride single crystal represented by the chemical formula: $M_{1-x}RE_xF_{2+x-w}$ (hereinafter, frequently referred to as "BaEuF single crystal"). In the above chemical formula, M is at least one metal element belonging to Group 2 of the Periodic Table selected from the group consisting of Be, Mg, Ca, Sr, and Ba, and RE is a rare earth element. Further, the relationships: $0<x\leq0.4$ and $0\leq w\leq0.5$ are satisfied.

It is preferred that M is Ba and RE is Eu. It is more preferred that the relationship: $0.05\leq x\leq0.3$ is satisfied.

A part of M may be substituted with at least one element selected from the group consisting of metal elements belonging to Groups 3, 4, 5, 13, and 14 of the Periodic Table.

Further, a part of RE may be substituted with at least one element selected from the group consisting of Sc, Y, and rare earth elements.

Further, a part of F may be substituted with at least one element selected from the group consisting of Cl, Br, and I.

The UV photoexcited red light-emitting material comprising the above-mentioned fluoride single crystal has an excitation peak wavelength in the range of from 250 to 425 nm, and serves as a red light-emitting material having a light emission peak wavelength in the range of from 580 to 720 nm. By using in combination this UV photoexcited red light-emitting material and a UV light emitting device having a light emission peak wavelength in the range of from 250 to 425 nm, a red light emitting apparatus having high luminance and high efficiency can be achieved.

The above-mentioned fluoride single crystal has high stability so that the crystal suffers no phase transition. Therefore, the formation of a crack in the single crystal being cut can be satisfactorily suppressed, so that the generation of the second phase in the crystal can be prevented, making it possible to obtain the single crystal having an increased size.

Further, the fluoride single crystal can be grown at a relatively low temperature, making it possible to reduce the cost for production of the light emitting material.

<Method for Producing the UV Photoexcited Red Light-Emitting Material>

The above-mentioned UV photoexcited red light-emitting material can be grown by a melt-solidification method, for example, as follows.

Predetermined raw materials are first individually weighed at a predetermined molar ratio.

Then, the weighed raw materials are mixed together in a crucible, and the crucible is placed in a vacuum created using a vacuum pump, and then the atmosphere in a vacuum is changed to a $CF_4$ (>99.99%) atmosphere and the resultant mixture is slowly molten, followed by gradual cooling.

Thus, a UV photoexcited red light-emitting material comprising a fluoride single crystal represented by the chemical formula: $M_{1-x}RE_xF_{2+x-w}$ can be produced through the above process.

Alternatively, the UV photoexcited red light-emitting material can be grown by a Czochralski (hereinafter, referred to as "Cz") method, for example, as follows.

Predetermined raw materials are first individually weighed at a predetermined molar ratio, and then the weighed raw materials are mixed together in a crucible, and the crucible is placed in a vacuum created using a vacuum pump, and then the atmosphere in a vacuum is changed to a $CF_4$ (>99.99%) atmosphere and the resultant mixture is slowly molten, followed by gradual cooling, to form a first single crystal in a substantially disc shape. Subsequently, a seed crystal in a rod shape is cut out from the first single crystal.

Subsequently, predetermined raw materials are individually weighed at a predetermined molar ratio, and the weighed raw materials are mixed together in a crucible, and then the crucible is placed in a chamber, and a high vacuum is created in the chamber using a vacuum pump to efficiently remove oxygen from the chamber, and then the atmosphere in the chamber is changed to a $CF_4$ (>99.99%) atmosphere.

Then, the crucible is heated using a high-frequency coil connected to a high-frequency generator (30 kW) to slowly melt the raw material mixture in the crucible.

Then, one end side of the seed crystal in a rod shape is brought into contact with the molten liquid in the crucible, and, while rotating the seed crystal around the center axis, the seed crystal is pull up from the molten liquid, causing a single crystal to grow on the one end side of the seed crystal in contact with the molten liquid. For example, the rotational speed is 1 to 50 rpm and the pulling speed is 0.1 to 10 mm/h.

Thus, a single crystal can be formed around the rod from one end side of the rod.

Subsequently, the formed single crystal is cut into a predetermined shape, for example, a substantially cylindrical shape.

Thus, a UV photoexcited red light-emitting material comprising a fluoride single crystal represented by the chemical formula: $M_{1-x}RE_xF_{2+x-w}$ can be produced through the above process.

Further alternatively, the fluoride single crystal can be produced by a Bridgman method.

Crystal growth by a Bridgman method is conducted, for example, as follows.

Predetermined raw materials are individually weighed at a predetermined molar ratio, and the raw materials are mixed by stirring in a crucible, and then the crucible is placed in a chamber.

Then, a high vacuum is created in the chamber using a vacuum pump to efficiently remove moisture from the chamber, and, while maintaining the high vacuum, an electric current is allowed to flow through a heat source of a resistance heating type arranged around the crucible to melt the raw materials in the crucible. The heat source has a temperature gradient such that the upper portion has a temperature higher than the melting point of the raw materials and the lower portion has a temperature lower than the melting point of the raw materials.

After the raw materials are molten, the crucible is moved from the upper portion of the heat source having a temperature higher than the melting point of the raw materials toward the lower portion having a temperature lower than the melting point. In this instance, a single crystal is grown from the molten liquid in the crucible positioned in a portion at the melting point or a temperature lower than the melting point. This operation is continuously conducted, enabling continuous growth of a single crystal.

In the production of the UV photoexcited red light-emitting material, the above-mentioned melt-solidification method, Cz method, or Bridgman method is preferably used. This is because a fluoride single crystal having stable properties can be easily obtained.

The method for producing the UV photoexcited red light-emitting material is not limited to the above-mentioned methods. Other methods, such as a floating zone method (FZ method), a micro-pulling down method (μ-PD method), and a zone melting method, can be used.

However, when the UV photoexcited red light-emitting material is produced using a melt-solidification method, a Cz method, or a Bridgman method, the resultant fluoride single crystal has high stability so that the crystal suffers no phase transition. Therefore, the formation of a crack in the single crystal being cut can be satisfactorily suppressed, so that the generation of the second phase in the crystal can be prevented, making it possible to obtain the single crystal having an increased size. Further, the fluoride single crystal can be grown at a relatively low temperature, making it possible to reduce the cost for production of the light emitting material.

<Light Emitting Apparatus>

FIG. 1 shows diagrammatic views of the light emitting apparatus according to the first embodiment of the invention, wherein (a) is a cross-sectional view of the light emitting apparatus, and (b) is a cross-sectional view of a light emitting device constituting the light emitting apparatus and the portions around the light emitting device.

As shown in FIG. 1(a), the light emitting apparatus 1 substantially has a ceramic substrate 3, a UV light emitting device (UV-LED) 10 disposed on the ceramic substrate 3, and a body 4 which is provided on the ceramic substrate 3 and in a wall-like form surrounding the UV light emitting device 10.

The ceramic substrate 3 is a plate-form member formed from a ceramic, such as $Al_2O_3$. The ceramic substrate 3 has on the surface thereof patterned wiring portions 31, 32 made from a metal, such as tungsten.

The body 4 is a member formed on the ceramic substrate 3 and made from a white resin, and has formed in the center thereof an opening 4A. The opening 4A has a tapered form such that the opening width is gradually increased outward from the ceramic substrate 3 side. The inner surface of the opening 4A serves as a reflection surface 40 for reflecting the light emitted from the UV light emitting device 10 outward.

As shown in FIG. 1(b), in the UV light emitting device 10, an n-side electrode 15A and a p-side electrode 15B are mounted on the wiring portions 31, 32 on the ceramic substrate 3 through bumps 16, 16 and they are electrically connected.

<UV Light Emitting Device>

As the UV light emitting device 10, a flip chip device capable of emitting an ultraviolet (UV) light having a light emission peak wavelength in the range of from 250 to 425 nm is used. As a material for the UV light emitting device 10, an AlGaN compound semiconductor can be used.

As shown in FIG. 1(b), in the UV light emitting device 10, on the first principal surface 11a of a device substrate 11 formed from sapphire or the like, an n-type AlGaN:Si layer 12 through a buffer layer and an $n^+$-GaN:Si layer, an AlGaN light emission layer 13 having a multiple quantum well structure, and a p-type AlGaN:Mg layer 14 through a $p^+$-GaN:Mg layer on the p-type electrode 15B side are formed in this order. An n-side electrode 15A is formed on the exposed portion of the n-type AlGaN:Si layer 12, and a p-side electrode 15B is formed on the surface of the p-type AlGaN:Mg layer 14.

Carriers are injected into the AlGaN light emission layer 13 from the n-type AlGaN:Si layer 12 and p-type AlGaN:Mg layer 14, so that the AlGaN light emission layer 13 emits a UV light. The UV light passes through the n-type AlGaN:Si layer 12 and device substrate 11 and is emitted from the second principal surface 11b of the device substrate 11. That is, the second principal surface 11b of the device substrate 11 serves as a light emission surface of the light emitting device 10.

The light emission surface is the surface of the UV light emitting device, and the surface through which a light, especially in a large amount, from the inside to the outside of the device.

The UV photoexcited red light-emitting material 2 is arranged in contact with the second principal surface 11b of the device substrate 11, which is the light emission surface of the UV light emitting device 10, so as to entirely cover the second principal surface 11b.

The UV photoexcited red light-emitting material 2 comprises one single crystal and is in a flat plate form, and therefore the first surface 2a opposite to the device substrate 11 can be directly in contact with and fixed to the device substrate 11 without using an epoxy resin between the first surface 2a and the second principal surface 11b of the device substrate 11. As an example of the method for fixing the UV photoexcited red light-emitting material 2, there can be mentioned a method for fixing the material using a metal piece.

The term "one single crystal" means a single crystal which has a size equivalent to or larger than the size of the second principal surface 11b and the whole of which can be substantially regarded as one single crystal.

When the first surface 2a is directly in contact with and fixed to the device substrate 11 without using an epoxy resin between the first surface 2a and the second principal surface 11b of the device substrate 11, the light emitted from the UV light emitting device 10 can enter the UV photoexcited red light-emitting material 2 with a reduced loss of the light, making it possible to improve the light emission efficiency of the UV photoexcited red light-emitting material 2.

<Light Emission Mechanism of the Light Emitting Apparatus>

In the light emitting apparatus according to the first embodiment of the invention shown in FIG. 1, when electricity is conducted through the UV light emitting device 10, electrons are injected into the AlGaN light emission layer 13 through the wiring portion 31, n-side electrode 15A, and n-type AlGaN:Si layer 12. Further, holes are injected into the AlGaN light emission layer 13 through the wiring portion 32, p-side electrode 15B, and p-type AlGaN:Mg layer 14, so that the AlGaN light emission layer 13 emits a UV light. The UV light from the AlGaN light emission layer 13 passes through the n-type AlGaN:Si layer 12 and device substrate 11 and is emitted from the second principal surface 11b of the device substrate 11, and enters the first surface 2a of the UV photoexcited red light-emitting material 2.

The UV light, which has entered the first surface 2a, serves as a light for excitation and excites the UV photoexcited red light-emitting material 2. The UV photoexcited red light-emitting material 2 absorbs the UV light from the UV light emitting device 10, and wavelength-converts the absorbed UV light in wavelength into, for example, a red light having a light emission peak wavelength in the range of from 580 to 720 nm, so that the light emitting apparatus 1 emits a red light.

The light emitting apparatus 1 of the first embodiment of the invention uses the UV photoexcited red light-emitting material 2 in a flat plate form comprising one single crystal, and does not use a binder, such as an epoxy resin, for binding fluorescent substances in a particulate form, and therefore is free of a problem of the deterioration of the binder, particularly the deterioration caused due to irradiation with a high power light for excitation, making it possible to suppress a lowering of the light emission efficiency.

Further, the UV photoexcited red light-emitting material 2 in a flat plate form comprising one single crystal can be reduced in surface area, as compared to the case where a number of fluorescent substances in a particulate form are bound together, making it possible to suppress the deterioration of properties caused due to the influence of an external environment.

The UV photoexcited red light-emitting material 2 in a flat plate form comprising one single crystal is used and therefore, by increasing the quantum efficiency of the UV photoexcited red light-emitting material 2, the light emission efficiency of the light emitting apparatus 1 can be improved.

Further, in the light emitting apparatus 1 of the first embodiment of the invention, as the UV photoexcited red light-emitting material 2, a BaEuF single crystal is used. Therefore, the UV photoexcited red light-emitting material 2 can efficiently absorb the UV light emitted from the UV light emitting device 10 to emit a red light with high luminance at high quantum efficiency.

Second Embodiment

Figure 2:
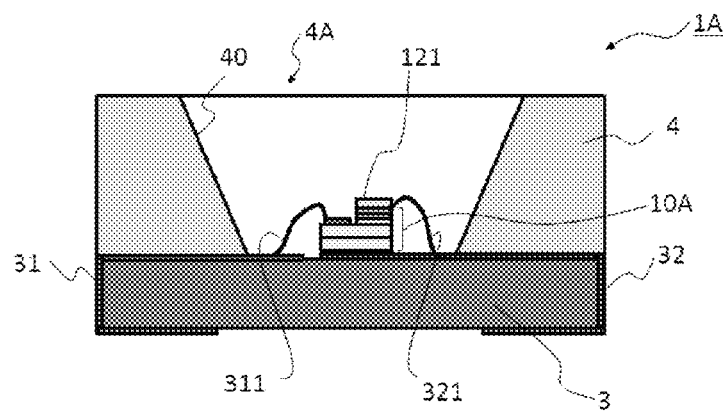
FIG. 2 shows diagrammatic views of the light emitting apparatus according to the second embodiment of the invention, wherein (a) is a cross-sectional view of the light emitting apparatus, (b) is a cross-sectional view of a light emitting device constituting the light emitting apparatus and the portions around the light emitting device, and (c) is a plan view of the light emitting device constituting the light emitting apparatus.
Figure 2:
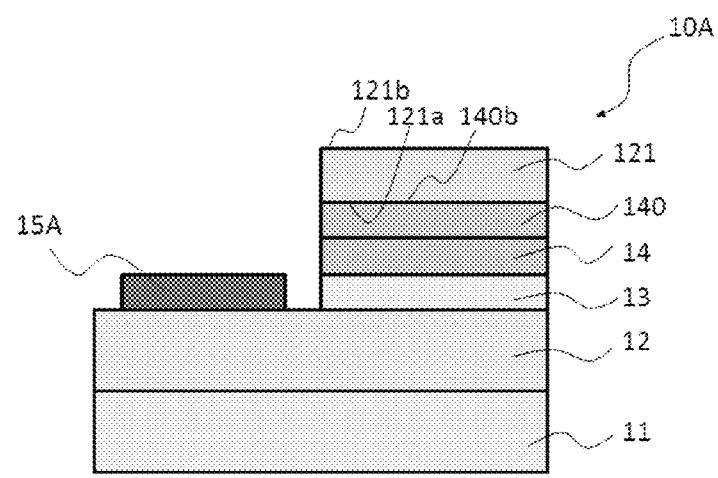
Figure 2:
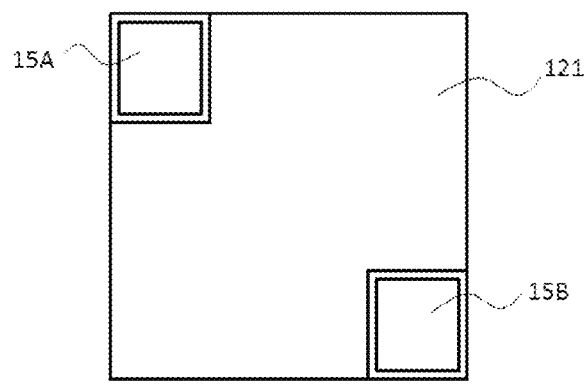

FIG. 2 shows diagrammatic views of the light emitting apparatus according to the second embodiment of the invention, wherein (a) is a cross-sectional view of the light emitting apparatus 1A, (b) is a cross-sectional view of a light emitting device constituting the light emitting apparatus and the portions around the light emitting device, and (c) is a plan view (c) of the light emitting device constituting the light emitting apparatus.

The light emitting apparatus 1A of the second embodiment of the invention has a light emission mechanism that the UV light emitted from the UV light emitting device enters the UV photoexcited red light-emitting material comprising one single crystal and is wavelength-converted in the UV photoexcited red light-emitting material, and this mechanism is similar to that of the light emitting apparatus 1 of the first embodiment. On the other hand, the light emitting apparatus 1A is different from the light emitting apparatus 1 with respect to the construction of the UV light emitting device and the arrangement of the UV photoexcited red light-emitting material for the UV light emitting device. Hereinbelow, with respect to the constituents of the light emitting apparatus 1A having the same functions and constructions as those described in the first embodiment, common reference numerals are used in FIG. 2, and the descriptions of these constituents are omitted.

As shown in FIGS. 2(a) and 2(b), the light emitting apparatus 1A is arranged so that the device substrate 11 of the UV light emitting device 10A faces the ceramic substrate 3 side. A UV photoexcited red light-emitting material 121 comprising one BaEuF single crystal is bonded to the UV light emitting device 10A on the opening 4A side. With respect to the UV photoexcited red light-emitting material 121, the same material as the UV photoexcited red light-emitting material 2 in the first embodiment can be used.

As shown in FIGS. 2(b) and 2(c), the UV light emitting device 10A has a device substrate 11, an n-type AlGaN:Si layer 12, a light emission layer 13, and a p-type AlGaN:Mg layer 14. Further, the UV light emitting device 10A has, on the p-type AlGaN:Mg layer 14, a transparent electrode 140 formed from ITO (Indium Tin Oxide). A p-side electrode 15B is formed on the transparent electrode 140. The transparent electrode 140 diffuses carriers injected from the p-side electrode 15B to inject the carriers into the p-type AlGaN:Mg layer 14.

The UV photoexcited red light-emitting material 121 is formed so that, as shown in FIG. 2(c), the material has recesses formed in the portions corresponding to the p-side electrode 15B and the n-side electrode 15A formed on the n-type AlGaN:Si layer 12.

As shown in FIG. 2(a), an n-side electrode 15A of the UV light emitting device 10A is connected to a wiring portion 31 of the ceramic substrate 3 through a bonding wire 311. The p-side electrode 15B of the UV light emitting device 10A is connected to a wiring portion 32 of the ceramic substrate 3 through a bonding wire 321.

When electricity is conducted through the UV light emitting device 10A having the above-mentioned construction, electrons are injected into the light emission layer 13 through the wiring portion 31, n-side electrode 15A, and n-type AlGaN:Si layer 12. Further, holes are injected into the light emission layer 13 through the wiring portion 32, p-side electrode 15B, transparent electrode 140, and p-type AlGaN:Mg layer 14. Thus, the light emission layer 13 emits a UV light.

The UV light from the light emission layer 13 passes through the p-type AlGaN:Mg layer 14 and transparent electrode 140 and is emitted from a surface 140b of the transparent electrode 140. That is, the surface 140b of the transparent electrode 140 serves as a light emission surface of the UV light emitting device 10A. The light emitted from the surface 140b of the transparent electrode 140 enters the first surface 121a of the UV photoexcited red light-emitting material 121.

The UV light, which has entered the UV photoexcited red light-emitting material 121 through the first surface 121a, serves as a light for excitation and excites the UV photoexcited red light-emitting material 121. The UV photoexcited red light-emitting material 121 absorbs the UV light from the UV light emitting device 10A, and wavelength-converts the absorbed light mainly into a red light. More specifically, the UV photoexcited red light-emitting material 121 is excited by the UV light from the light emitting device 10A having a light emission peak wavelength in the range of from 250 to 425 nm to emit a red light having a light emission peak wavelength in the range of from 580 to 720 nm. Thus, the light emitting apparatus 1A emits a red light.

In the second embodiment, the same actions and effects as those obtained in the first embodiment can be obtained.

Third Embodiment

Figure 3:
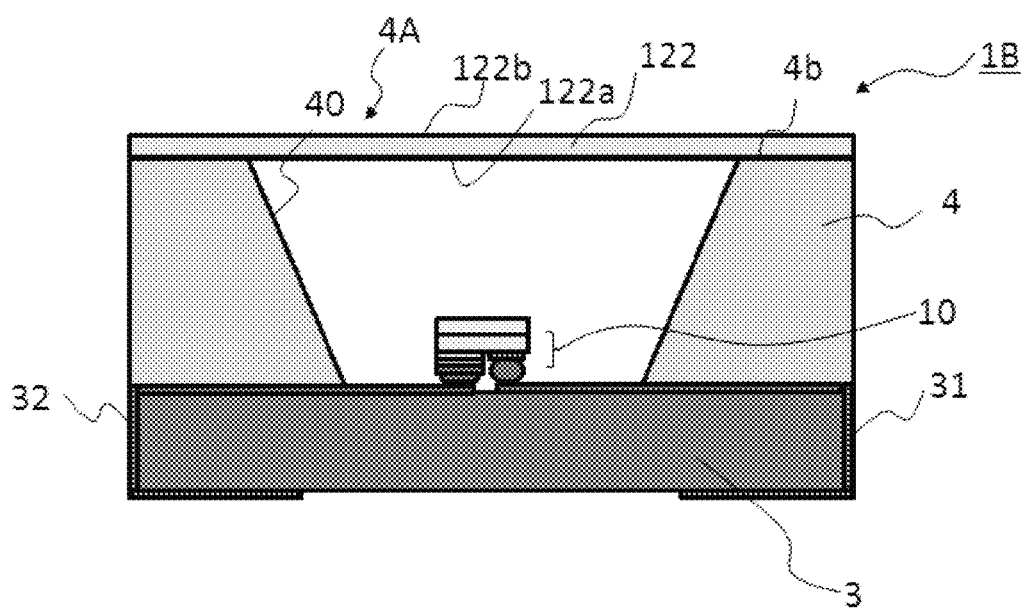
FIG. 3 is a cross-sectional view of the light emitting apparatus according to the third embodiment of the invention.

FIG. 3 is a cross-sectional view of the light emitting apparatus according to the third embodiment of the invention.

The light emitting apparatus 1B of the third embodiment of the invention has a light emission mechanism that the UV light emitted from the light emitting device enters the UV photoexcited red light-emitting material comprising one single crystal and is wavelength-converted in the UV photoexcited red light-emitting material, and this mechanism is similar to that of the light emitting apparatus 1 of the first embodiment. On the other hand, the light emitting apparatus 1B is different from the light emitting apparatus 1 with respect to the arrangement of the UV photoexcited red light-emitting material. Hereinbelow, with respect to the constituents of the light emitting apparatus 1B having the same functions and constructions as those described in the first and second embodiments, common reference numerals are used in FIG. 3, and the descriptions of these constituents are omitted.

As shown in FIG. 3, the light emitting apparatus 1B has, on a ceramic substrate 3, a UV light emitting device 10 having the same construction as that in the first embodiment. As shown in FIG. 1(b), the UV light emitting device 10 emits a UV light toward the opening 4A side of the body 4 from the second principal surface 11b of the device substrate 11 positioned on the opening 4A side of the body 4.

A UV photoexcited red light-emitting material 122 is bonded to the body 4 so as to cover the opening 4A of the body. The UV photoexcited red light-emitting material 122 is in a flat plate form and bonded to an upper surface 4b of the body 4. With respect to the UV photoexcited red light-emitting material 122, the same material as the UV photoexcited red light-emitting material 2 in the first embodiment can be used. Further, the UV photoexcited red light-emitting material 122 is larger than the UV light emitting device 10, and the whole of the material is substantially one single crystal.

When electricity is conducted through the light emitting apparatus 1B having the above-mentioned construction, the UV light emitting device 10 emits a UV light from the second principal surface 11b toward the UV photoexcited red light-emitting material 122. The UV photoexcited red light-emitting material 122 receives the UV light from the light emitting device 10 through the first surface 122a facing the light emission surface of the UV light emitting device 10, and is excited by the UV light to emit a red light outward from the second surface 122b. Thus, the light emitting apparatus 1B emits a red light.

In the third embodiment, the same actions and effects as those obtained in the first embodiment can be obtained. Further, in the light emitting apparatus 1B of the third embodiment, the UV light emitting device 10 and the UV photoexcited red light-emitting material 122 are arranged apart from each other, and therefore, the UV photoexcited red light-emitting material 122 having a large size can be used, as compared to the UV photoexcited red light-emitting material 2 arranged in contact with the light emission surface of the UV light emitting device 10, improving the easy fitting to the light emitting apparatus 1B.

Fourth Embodiment

Figure 4:
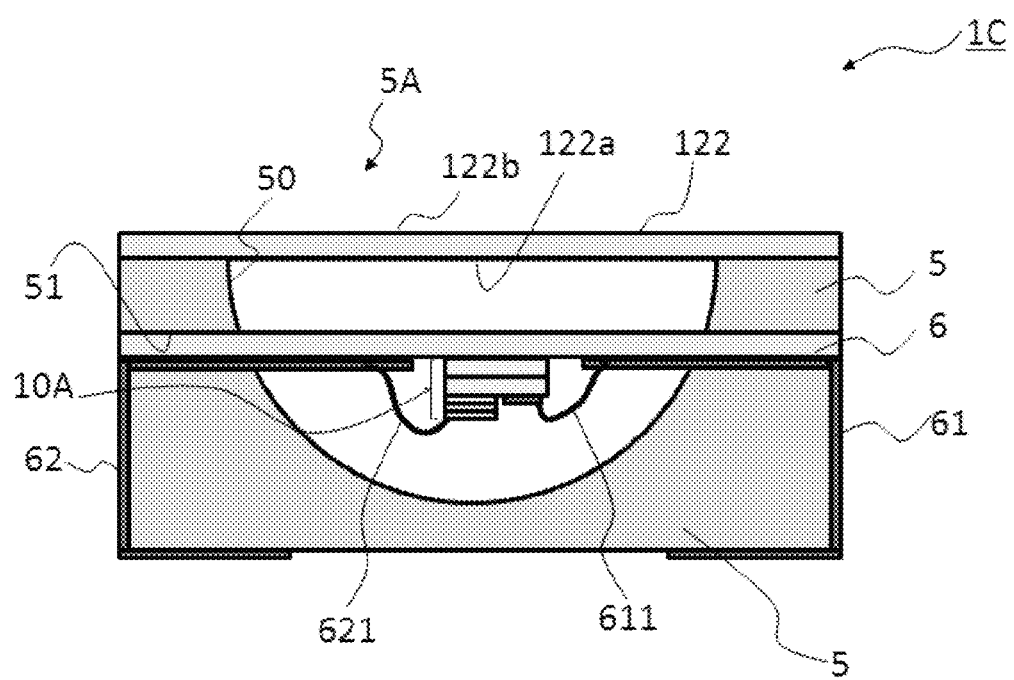
FIG. 4 is a cross-sectional view of the light emitting apparatus according to the fourth embodiment of the invention.

FIG. 4 is a cross-sectional view of the light emitting apparatus according to the fourth embodiment of the invention.

As shown in FIG. 4, the light emitting apparatus 1C of the fourth embodiment of the invention is different from the light emitting apparatus 1B of the third embodiment with respect to the positional relationship between the UV light emitting device, the substrate on which the UV light emitting device is mounted, and the UV photoexcited red light-emitting material. Hereinbelow, with respect to the constituents of the light emitting apparatus 1C having the same functions and constructions as those described in the first, second, and third embodiments, common reference numerals are used in FIG. 4, and the descriptions of these constituents are omitted.

The light emitting apparatus 1C of the fourth embodiment of the invention has a body 5 formed from a white resin, and a transparent substrate 6 held by a holding portion 51 in a slit form formed in the body 5. The light emitting apparatus 1C has a UV photoexcited red light-emitting material 122 comprising one BaEuF single crystal disposed so as to cover an opening 5A of the body 5. Further, the light emitting apparatus 1C has a UV light emitting device 10A mounted on the surface of the transparent substrate 6 which is on the side opposite the UV photoexcited red light-emitting material 122, and wiring portions 61, 62 for conducting electricity through the UV light emitting device 10A. The composition of the UV photoexcited red light-emitting material 122 is the same as that of the UV photoexcited red light-emitting material 2 in the first embodiment.

The body 5 has a curved depressed portion formed in the center thereof, and the surface of the depressed portion serves as a reflection surface 50 for reflecting the light emitted from the UV light emitting device 10A toward the UV photoexcited red light-emitting material 122 side.

The transparent substrate 6 is formed from a member having light transmitting properties, for example, a resin having light transmitting properties, such as a silicone resin, an acrylic resin, or PET, a glass substance, or a single crystal or polycrystal of sapphire, a ceramic, quartz, AlN, or the like. The transparent substrate 6 has light transmitting properties such that the substrate transmits the UV light from the UV light emitting device 10A, and insulating properties. To the transparent substrate 6 are bonded part of the wiring portions 61, 62. The n-side electrode and p-side electrode of the UV light emitting device 10A are electrically connected to one end portions of the wiring portions 61, 62 through bonding wires 611, 621.

When electricity is conducted through the light emitting apparatus 1C having the above-mentioned construction, the UV light emitting device 10A emits a UV light, and a part of the UV light passes through the transparent substrate 6 and enters the first surface 122a of the UV photoexcited red light-emitting material 122. The remaining UV light is reflected off the reflection surface 50 of the body 5 and passes through the transparent substrate 6 and enters the first surface 122a of the UV photoexcited red light-emitting material 122.

The UV light, which has entered the UV photoexcited red light-emitting material 122, is absorbed by the UV photoexcited red light-emitting material 122 and wavelength-converted. The light emitting apparatus 1C emits a red light wavelength-converted by UV photoexcited red light-emitting material 122.

In the fourth embodiment, the same actions and effects as those obtained in the third embodiment can be obtained. Further, in the light emitting apparatus 1C, the UV light emitted from the UV light emitting device 10A to the side opposite the UV photoexcited red light-emitting material 122 is reflected off the reflection surface 50, and passes through the transparent substrate 6 and enters the UV photoexcited red light-emitting material 122, and therefore the efficiency of taking light is improved.

Fifth Embodiment

Figure 5:
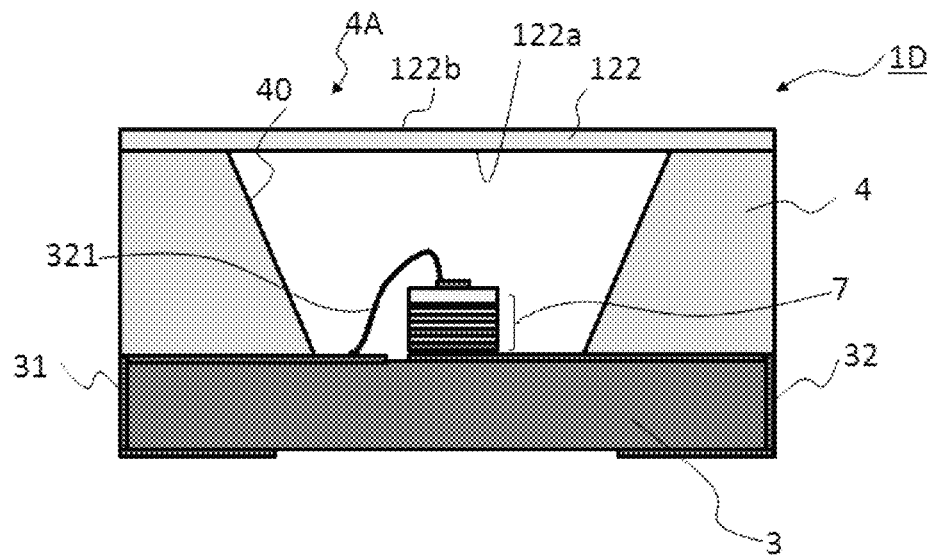
FIG. 5 shows diagrammatic views of the light emitting apparatus according to the fifth embodiment of the invention, wherein (a) is a cross-sectional view of the light emitting apparatus, and (b) is a cross-sectional view of a light emitting device constituting the light emitting apparatus.
Figure 5:
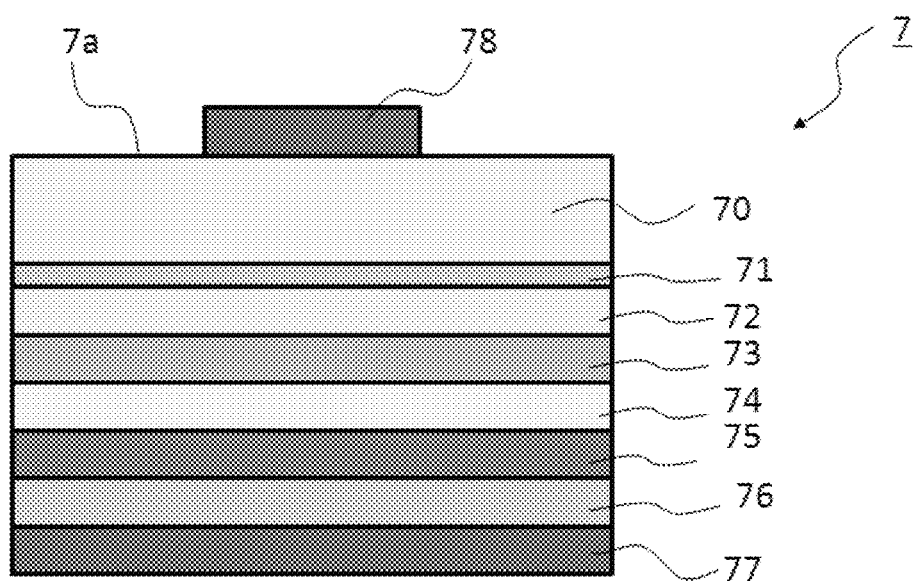

FIG. 5 shows diagrammatic views of the light emitting apparatus according to the fifth embodiment of the invention, wherein (a) is a cross-sectional view of the light emitting apparatus, and (b) is a cross-sectional view of a light emitting device constituting the light emitting apparatus.

As shown in FIG. 5(a), the light emitting apparatus 1D of the fifth embodiment of the invention is different from the light emitting apparatus 1B of the third embodiment with respect to the construction and arrangement of the UV light emitting device. Hereinbelow, with respect to the constituents of the light emitting apparatus 1D having the same functions and constructions as those described in the first, second, and third embodiments, common reference numerals are used in FIG. 5, and the descriptions of these constituents are omitted.

In the light emitting apparatus 1D, a UV light emitting device 7 is disposed on a wiring portion 32 formed on the ceramic substrate 3.

The UV light emitting device 7 is, as shown in FIG. 5(b), formed from a $\beta$-$Ga_2O_3$ substrate 70, a buffer layer 71, an Si-doped $n^+$-GaN layer 72, an Si-doped n-AlGaN layer 73, an MQW (Multiple-Quantum Well) layer 74, an Mg-doped p-AlGaN layer 75, an Mg-doped $p^+$-GaN layer 76, and a p electrode 77, which are stacked in this order. An n electrode

78 is formed on the surface of the β-Ga$_2$O$_3$ substrate 70 on the side opposite the buffer layer 71.

The β-Ga$_2$O$_3$ substrate 70 is formed from β-Ga$_2$O$_3$ which exhibits n-type conductivity. The MQW layer 74 is an Al$_a$Ga$_{1-a}$N/Al$_b$Ga$_{1-b}$N (wherein a and b are different from each other and independently a number of 0 or more) light emission layer having a multiple quantum well structure. The p electrode 77 is a transparent electrode comprising ITO (Indium Tin Oxide), and is electrically connected to a wiring portion 32. The n electrode 78 is connected to a wiring portion 31 of the ceramic substrate 3 through a bonding wire 321. As a device substrate, SiC may be used instead of β-Ga$_2$O$_3$.

When electricity is conducted through the UV light emitting device 7 having the above-mentioned construction, electrons are injected into the MQW layer 74 through the n electrode 78, β-Ga$_2$O$_3$ substrate 70, buffer layer 71, n$^+$-GaN layer 72, and n-AlGaN layer 73. Further, holes are injected into the MQW layer 74 through the p electrode 77, p$^+$-GaN layer 76, and p-AlGaN layer 75. Thus, the UV light emitting device 7 emits a UV light. The UV light passes through the β-Ga$_2$O$_3$ substrate 70 and others and is emitted from the light emission surface 7a of the UV light emitting device 7, and enters the first surface 122a of the UV photoexcited red light-emitting material 122. The UV photoexcited red light-emitting material 122 receives the UV light from the UV light emitting device 7 through the first surface 122a facing the light emission surface of the UV light emitting device 7, and is excited by the UV light to emit a red light outward from the second surface 122b. Thus, the light emitting apparatus 1D emits a red light.

In the fifth embodiment, the same actions and effects as those obtained in the third embodiment can be obtained.

Sixth Embodiment

Figure 6:
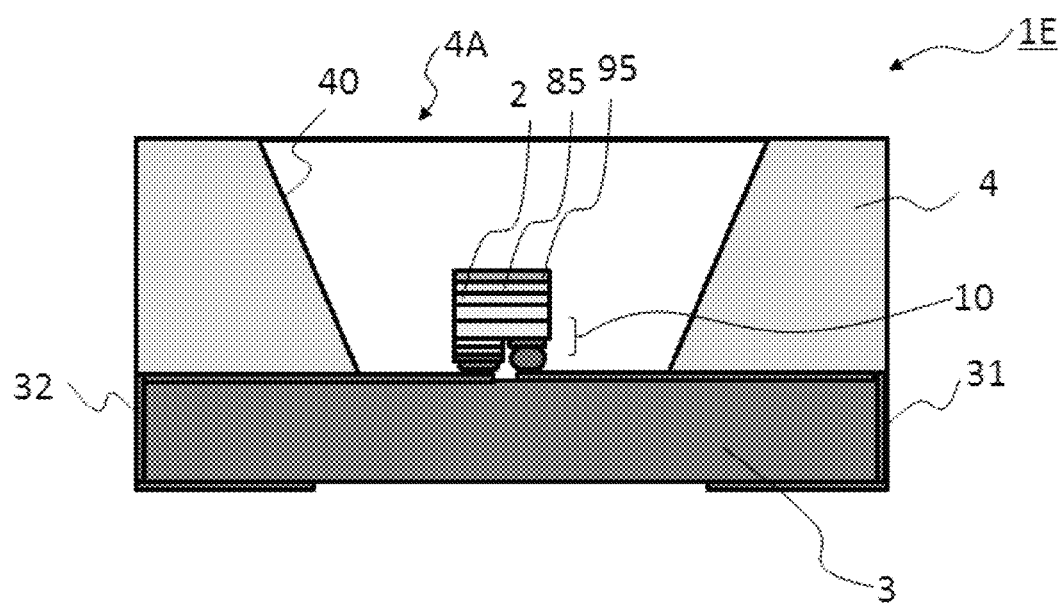
FIG. 6 is a cross-sectional view of the light emitting apparatus according to the sixth embodiment of the invention.

FIG. 6 is a cross-sectional view of the light emitting apparatus according to the sixth embodiment of the invention.

As shown in FIG. 6, in the light emitting apparatus 1E of the sixth embodiment, a UV photoexcited yellow light-emitting material is disposed on the UV photoexcited red light-emitting material on the UV light emitting device, and a UV photoexcited blue light-emitting material is disposed on the UV photoexcited yellow light-emitting material. Except for this, the construction is the same as that of the light emitting apparatus 1 of the first embodiment. Hereinbelow, with respect to the constituents of the light emitting apparatus having the same functions and constructions as those described in the first through fifth embodiments, common reference numerals are used in FIG. 6, and the descriptions of these constituents are omitted.

In the light emitting apparatus 1E, a UV photoexcited yellow light-emitting material 85 is disposed on the UV photoexcited red light-emitting material 2 on the UV light emitting device 10, and a UV photoexcited blue light-emitting material 95 is disposed on the UV photoexcited yellow light-emitting material 85. The UV photoexcited red light-emitting material 2 emits a red light using a part of the UV light from the UV light emitting device 10, the UV photoexcited yellow light-emitting material 85 emits a yellow light using another part of the UV light from the UV light emitting device 10, and the UV photoexcited blue light-emitting material 95 emits a blue light using the remaining UV light from the UV light emitting device 10. The thus emitted red light, yellow light, and blue light are mixed together, so that the light emitting apparatus 1E emits a white light.

Seventh Embodiment

Figure 7:
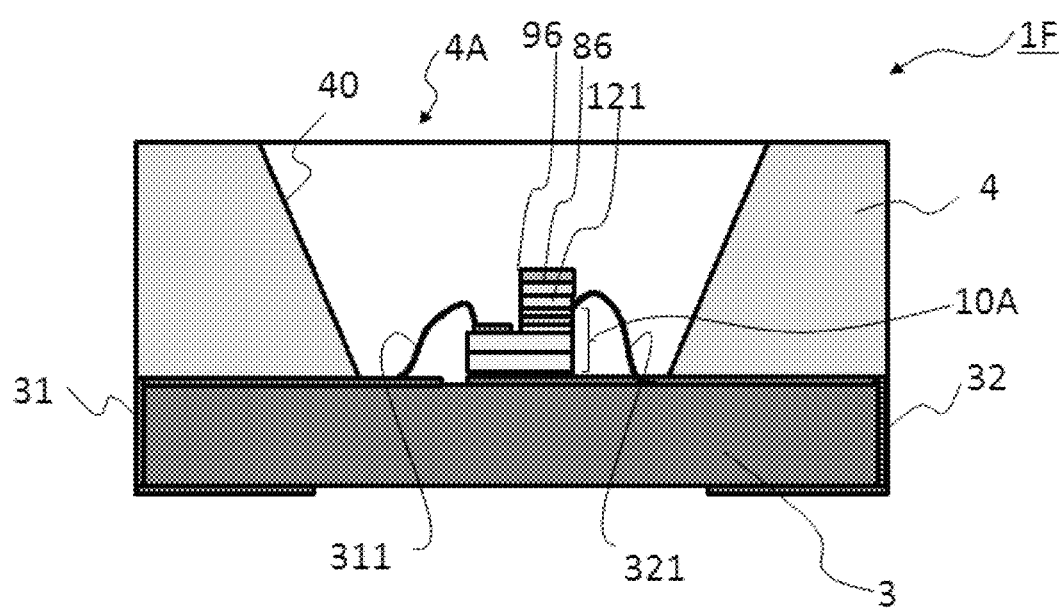
FIG. 7 is a cross-sectional view of the light emitting apparatus according to the seventh embodiment of the invention.

FIG. 7 is a cross-sectional view of the light emitting apparatus according to the seventh embodiment of the invention.

As shown in FIG. 7, in the light emitting apparatus according to the seventh embodiment, a UV photoexcited yellow light-emitting material is disposed on the UV photoexcited red light-emitting material on the UV light emitting device, and a UV photoexcited blue light-emitting material is disposed on the UV photoexcited yellow light-emitting material. Except for this, the construction is the same as that of the light emitting apparatus 1A of the second embodiment. Hereinbelow, with respect to the constituents of the light emitting apparatus having the same functions and constructions as those described in the first through sixth embodiments, common reference numerals are used in FIG. 7, and the descriptions of these constituents are omitted.

In the light emitting apparatus 1F, a UV photoexcited yellow light-emitting material 86 is disposed on the UV photoexcited red light-emitting material 121 on the UV light emitting device 10A, and a UV photoexcited blue light-emitting material 96 is disposed on the UV photoexcited yellow light-emitting material 86. The UV photoexcited red light-emitting material 121 emits a red light using a part of the UV light from the UV light emitting device 10A, the UV photoexcited yellow light-emitting material 86 emits a yellow light using another part of the UV light from the UV light emitting device 10A, and the UV photoexcited blue light-emitting material 96 emits a blue light using the remaining UV light from the UV light emitting device 10A. The thus emitted red light, yellow light, and blue light are mixed together, so that the light emitting apparatus 1F emits a white light.

Eighth Embodiment

Figure 8:
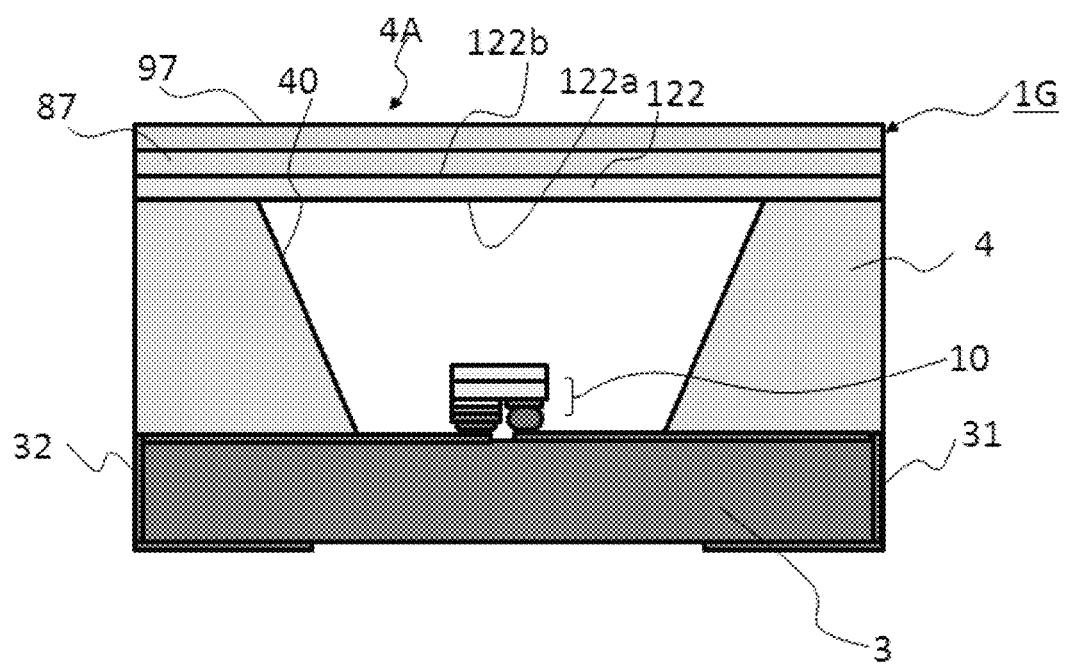
FIG. 8 is a cross-sectional view of the light emitting apparatus according to the eighth embodiment of the invention.

FIG. 8 is a cross-sectional view of the light emitting apparatus according to the eighth embodiment of the present invention.

As shown in FIG. 8, in the light emitting apparatus according to the eighth embodiment, a UV photoexcited yellow light-emitting material is disposed on the UV photoexcited red light-emitting material, and a UV photoexcited blue light-emitting material is disposed on the UV photoexcited yellow light-emitting material. Except for this, the construction is the same as that of the light emitting apparatus 1B of the third embodiment. Hereinbelow, with respect to the constituents of the light emitting apparatus having the same functions and constructions as those described in the first through seventh embodiments, common reference numerals are used in FIG. 8, and the descriptions of these constituents are omitted.

In the light emitting apparatus 1G, a UV photoexcited yellow light-emitting material 87 is disposed on the UV photoexcited red light-emitting material 122, and a UV photoexcited blue light-emitting material 97 is disposed on the UV photoexcited yellow light-emitting material 87. The UV photoexcited red light-emitting material 122 emits a red light using a part of the UV light from the UV light emitting device 10, the UV photoexcited yellow light-emitting material 87 emits a yellow light using another part of the UV light from the UV light emitting device 10, and the UV photoexcited blue light-emitting material 97 emits a blue light using the remaining UV light from the UV light emitting device 10. The thus emitted red light, yellow light, and blue light are mixed together, so that the light emitting apparatus 1G emits a white light.

Ninth Embodiment

Figure 9:
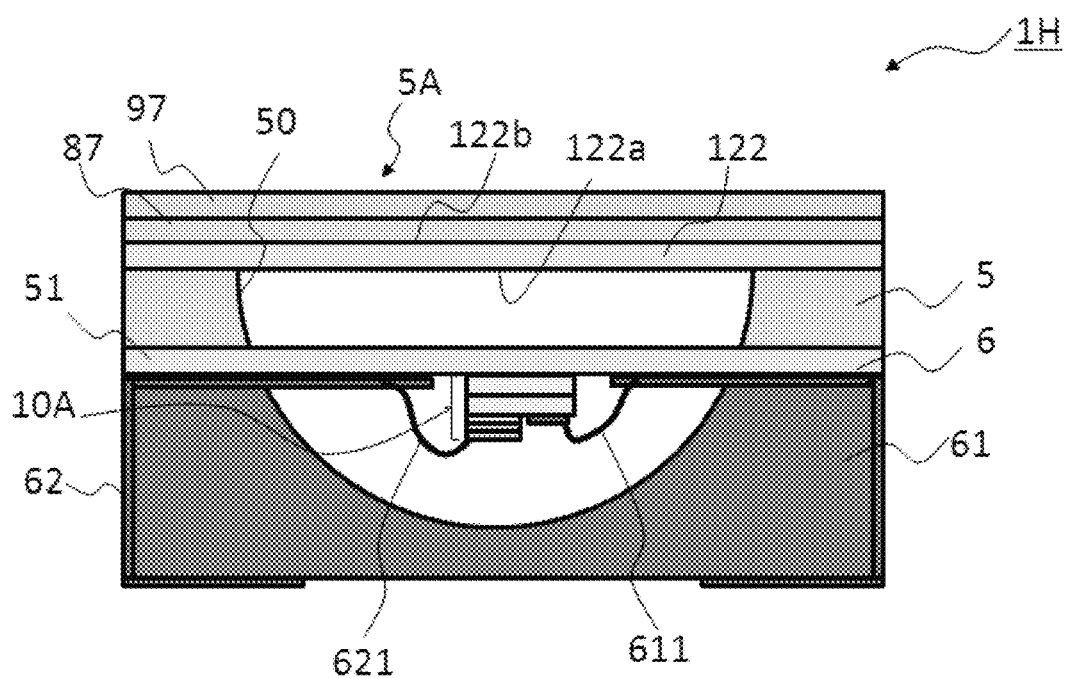
FIG. 9 is a cross-sectional view of the light emitting apparatus according to the ninth embodiment of the invention.

FIG. 9 is a cross-sectional view of the light emitting apparatus according to the ninth embodiment of the invention.

As shown in FIG. 9, in the light emitting apparatus according to the ninth embodiment, a UV photoexcited yellow light-emitting material is disposed on the UV photoexcited red light-emitting material, and a UV photoexcited blue light-emitting material is disposed on the UV photoexcited yellow light-emitting material. Except for this, the construction is the same as that of the light emitting apparatus 1C of the fourth embodiment. Hereinbelow, with respect to the constituents of the light emitting apparatus having the same functions and constructions as those described in the first through eighth embodiments, common reference numerals are used in FIG. 9, and the descriptions of these constituents are omitted.

In the light emitting apparatus 1H, a UV photoexcited yellow light-emitting material 87 is disposed on the UV photoexcited red light-emitting material 122, and a UV photoexcited blue light-emitting material 97 is disposed on the UV photoexcited yellow light-emitting material 87. The UV photoexcited red light-emitting material 122 emits a red light using a part of the UV light from the UV light emitting device 10A, the UV photoexcited yellow light-emitting material 87 emits a yellow light using another part of the UV light from the UV light emitting device 10A, and the UV photoexcited blue light-emitting material 97 emits a blue light using the remaining UV light from the UV light emitting device 10A. The thus emitted red light, yellow light, and blue light are mixed together, so that the light emitting apparatus 1H emits a white light.

Tenth Embodiment

Figure 10:
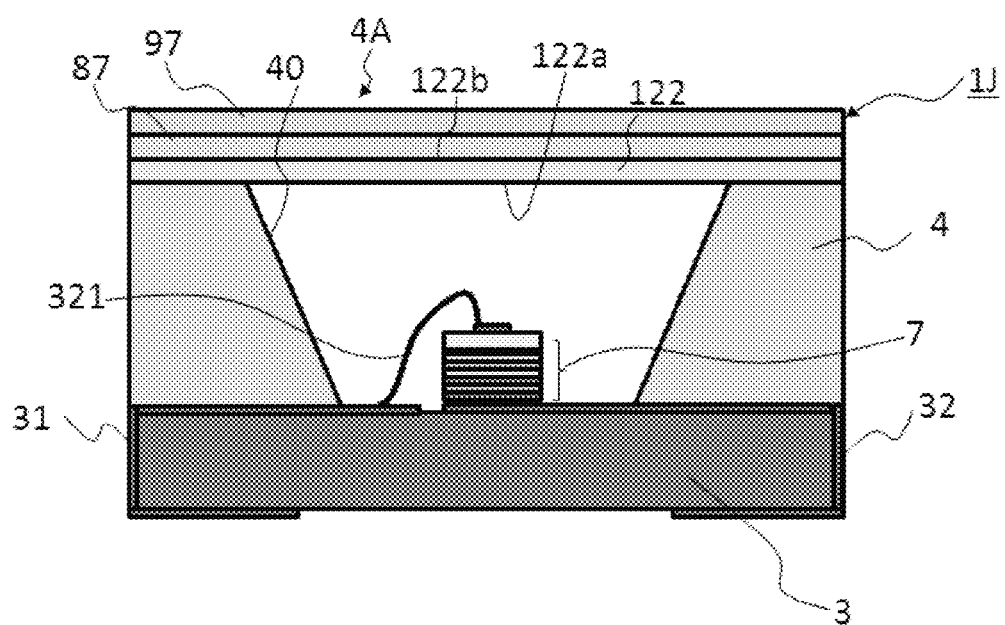
FIG. 10 is a cross-sectional view of the light emitting apparatus according to the tenth embodiment of the invention.

FIG. 10 is a cross-sectional view of the light emitting apparatus according to the tenth embodiment of the invention.

As shown in FIG. 10, in the light emitting apparatus according to the tenth embodiment, a UV photoexcited yellow light-emitting material is disposed on the UV photoexcited red light-emitting material, and a UV photoexcited blue light-emitting material is disposed on the UV photoexcited yellow light-emitting material. Except for this, the construction is the same as that of the light emitting apparatus 1D of the fifth embodiment. Hereinbelow, with respect to the constituents of the light emitting apparatus having the same functions and constructions as those described in the first through ninth embodiments, common reference numerals are used in FIG. 10, and the descriptions of these constituents are omitted.

In the light emitting apparatus 1J, a UV photoexcited yellow light-emitting material 87 is disposed on the UV photoexcited red light-emitting material 122, and a UV photoexcited blue light-emitting material 97 is disposed on the UV photoexcited yellow light-emitting material 87. The UV photoexcited red light-emitting material 122 emits a red light using a part of the UV light from the UV light emitting device 7, the UV photoexcited yellow light-emitting material 87 emits a yellow light using another part of the UV light from the UV light emitting device 7, and the UV photoexcited blue light-emitting material 97 emits a blue light using the remaining UV light from the UV light emitting device 7. The thus emitted red light, yellow light, and blue light are mixed together, so that the light emitting apparatus 1J emits a white light.

In the light emitting apparatuses 1E, 1F, 1G, 1H, 1J of the sixth through tenth embodiments, it is preferred that each of the UV photoexcited blue light-emitting materials 95, 96, 97 is a Ce:$R_2SiO_5$ (wherein R is at least one of Lu, Y, and Gd) single crystal. This is because the use of the above single crystal can achieve light emission with high luminance, and further processing the single crystal into a predetermined size and fitting the single crystal to the UV light emitting devices 7, 10, 10A or light emitting apparatuses 1E, 1F, 1G, 1H, 1J are easy.

In the light emitting apparatuses 1E, 1F, 1G, 1H, 1J of the sixth through tenth embodiments, it is preferred that each of the UV photoexcited yellow light-emitting materials 85, 86, 87 is a cerium-added terbium-scandium-aluminum garnet-type single crystal.

Specifically, preferred is the UV photoexcited yellow light-emitting material comprising a single crystal represented by the chemical formula: $((Tb_{1-z}Ce_z)_{1-y}L_y)_a(M_{1-x}N_x)_bAl_cO_{1-w}$. In the above chemical formula, L represents at least one of Sc, Y, Lu, Yb, Tm, Mg, Ca, Hf, and Zr, M represents Sc, and N represents at least one of Tb, Ce, Y, Lu, Yb, Tm, Mg, Ca, Hf, and Zr. a, b, c, x, y, z, and w, respectively, satisfy the relationships: $2.5 \leq a \leq 3.5$, $0 \leq b \leq 2.5$, $2.5 \leq c \leq 5.5$, $0 \leq x \leq 1$, $0 \leq y \leq 0.5$, $0.0001 \leq z \leq 0.05$, and $0 \leq w \leq 0.5$.

The above material is preferred because the use of the above material can achieve light emission with high luminance, and further processing the material into a predetermined size and fitting the material to the UV light emitting devices 7, 10, 10A or light emitting apparatuses 1E, 1F, 1G, 1H, 1J are easy.

In the light emitting apparatuses 1E, 1F, 1G, 1H, 1J of the sixth through tenth embodiments, the UV photoexcited yellow light-emitting materials 85, 86, 87 and UV photoexcited blue light-emitting materials 95, 96, 97 are fitted to the UV photoexcited red light-emitting materials 2, 121, 122 on the outer side, namely, on the side opposite the UV light emitting devices 7, 10, 10A. However, there is no particular limitation with respect to the fitting of the UV photoexcited yellow light-emitting materials 85, 86, 87 and UV photoexcited blue light-emitting materials 95, 96, 97 to the UV photoexcited red light-emitting material 122. For example, the UV photoexcited yellow light-emitting materials 85, 86, 87 and UV photoexcited blue light-emitting materials 95, 96, 97 may be fitted to the UV photoexcited red light-emitting materials 2, 121, 122 on the inner side, namely, on the UV light emitting devices 7, 10, 10A side.

In the light emitting apparatuses 1E, 1F, 1G, 1H, 1J of the sixth through tenth embodiments, it is preferred that the thicknesses of the plates of the UV photoexcited red light-emitting materials 2, 121, 122, UV photoexcited yellow light-emitting materials 85, 86, 87, and UV photoexcited blue light-emitting materials 95, 96, 97 are controlled so that the CIE chromaticity coordinates for a white light are around (0.33, 0.33). In this case, the color purity can be improved so that the light emitting apparatus does not emit a bluish white or yellowish white light but emits a pure white light.

In the light emitting apparatuses 1, 1A, 1B, 1C, 1D, 1E, 1F, 1G, 1H, 1J of the first through tenth embodiments, the UV photoexcited red light-emitting materials 2, 121, 122 are arranged with respect to the UV light emitting devices 7, 10, 10A so that the light emitted from the UV light emitting devices 7, 10, 10A enters the UV photoexcited red light-emitting materials 2, 121, 122. Therefore, the UV photoexcited red light-emitting materials 2, 121, 122 can be efficiently excited by the light emitted from the UV light emitting devices 7, 10, 10A, enabling light emission with high luminance.

The form of the light emitting apparatus of the invention is not limited to those mentioned above. A construction such that one light emitting apparatus has a plurality of UV light emitting devices may be employed. Further, a single crystal material having a different color tone from that used in the invention, such as a green fluorescent substance, may be used in combination with the single crystal in the invention.

The UV photoexcited red light-emitting material and light emitting apparatus of the invention are not limited to the above-mentioned embodiments, and can be changed or modified within the scope of the technical ideas of the invention. Hereinbelow, the invention will be described in more detail with reference to the following Examples. However, the following Examples should not be construed as limiting the scope of the invention.

EXAMPLES

Example 1

<Preparation of a Sample in Example 1>

$BaF_2$ (form: powder; purity: 99.99% or more) and $EuF_3$ (form: powder; purity: 99.99% or more) were used as raw materials.

$BaF_2$ and $EuF_3$ were first individually weighed. The $BaF_2$:$EuF_3$ (molar ratio) was 87.5:12.5.

Then, the weighed $BaF_2$ and $EuF_3$ were mixed together in a crucible, and the crucible was placed in a vacuum created using a vacuum pump, and then the atmosphere in a vacuum was changed to a $CF_4$ (>99.99%) atmosphere and the resultant mixture was gradually molten. Subsequently, the molten mixture was slowly cooled, thus forming a single crystal in a disc shape (sample in Example 1) by a melt-solidification method.

Figure 11:
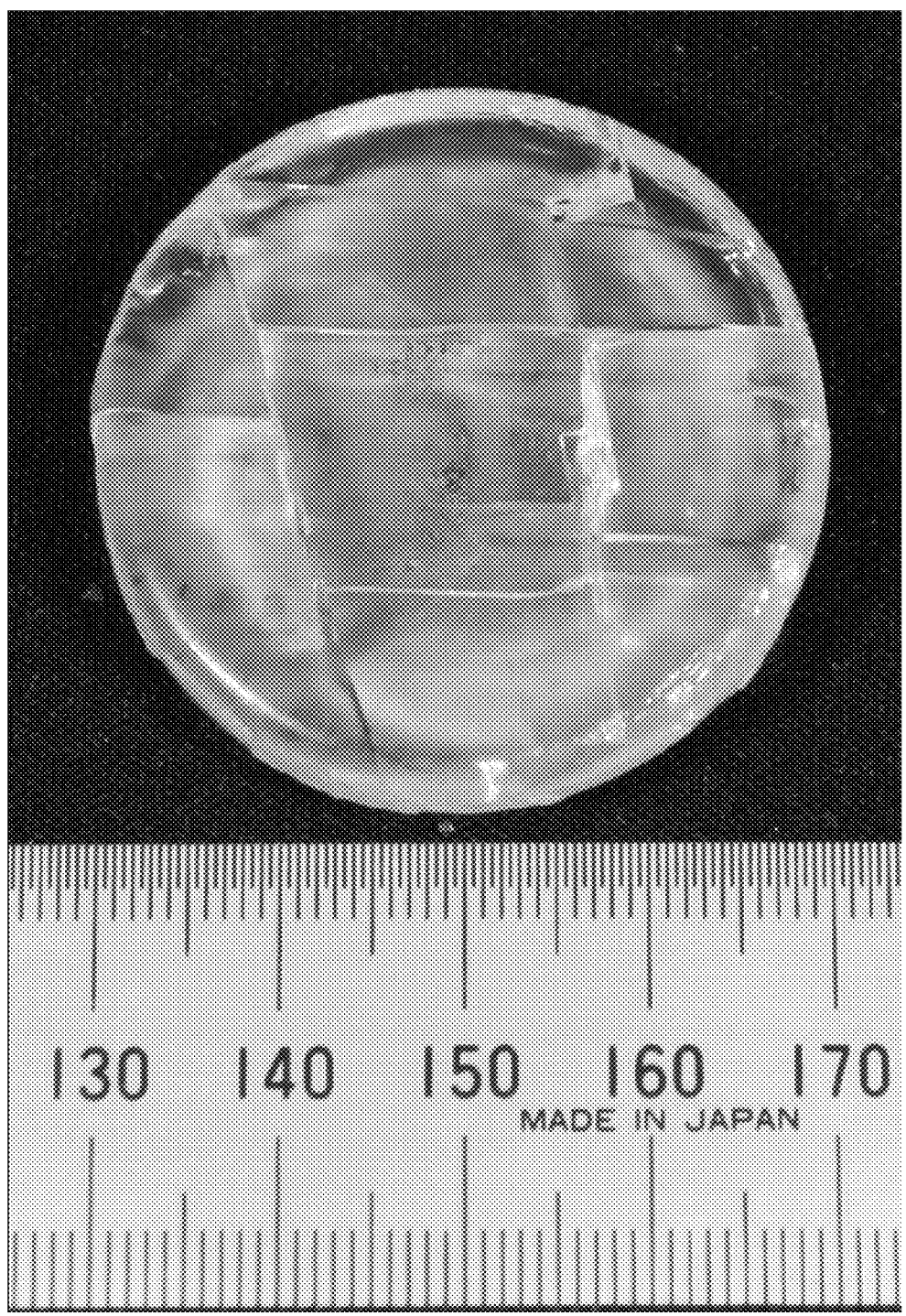
FIG. 11 is a photograph of the sample in Example 1.

FIG. 11 is a photograph of the sample in Example 1.

As shown in FIG. 11, the single crystal as the sample in Example 1 had a diameter of 4 cm. The single crystal had a thickness of 0.5 cm.

The sample in Example 1 was subjected to powder X-ray diffractometry. As a result, only diffraction peaks ascribed to BaEuF were observed, which confirmed that $BaF_2$ and $EuF_3$ did not remain. Thus, this single crystal was identified as $Ba_{0.875}Eu_{0.125}F_{2.125}$ (composition initially charged).

Then, the obtained single crystal was cut into a specimen having a size of 1.5×1.5×4.5 $mm^3$.

Then, the cut specimen was subjected to mirror polishing for the entire surface to obtain a sample for measurement.

<Evaluation of the Single Crystal>

Figure 12:
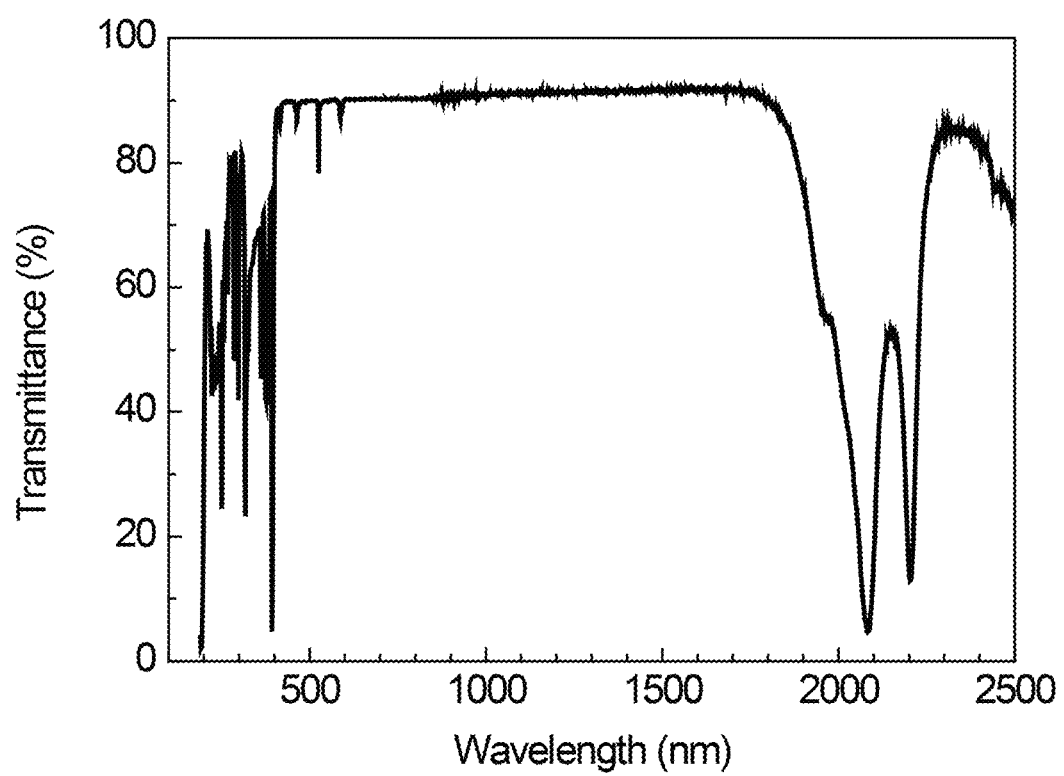
FIG. 12 is a transmission spectrum of the sample in Example 1.
Figure 13:
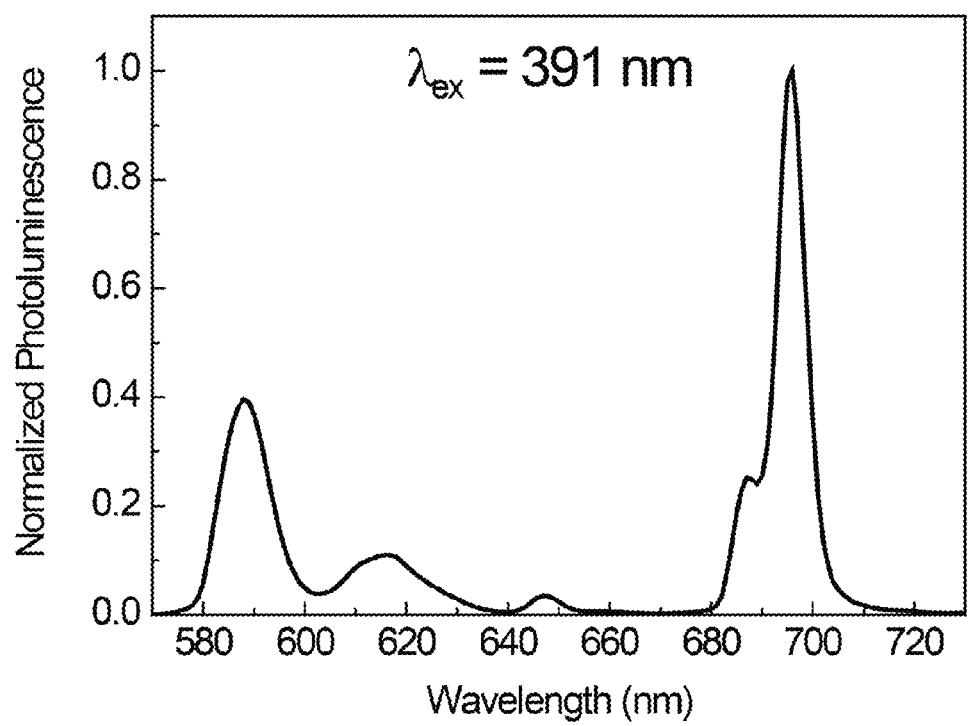
FIG. 13 is a fluorescence spectrum of the sample in Example 1.
Figure 14:
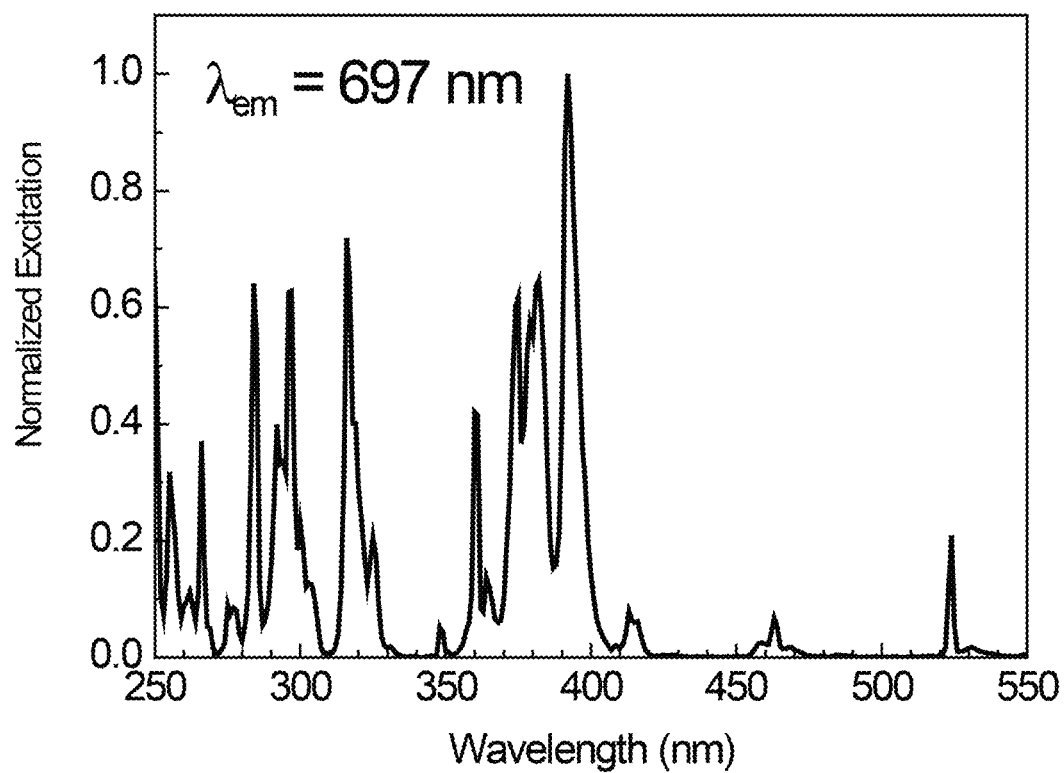
FIG. 14 is an excitation spectrum of the sample in Example 1.

With respect to the single crystal, a transmission spectrum, a fluorescence spectrum, and an excitation spectrum were measured. The results are shown in FIGS. 12, 13, and 14.

In the transmission spectrum, absorption peaks were seen in 200 to 400 nm.

In the fluorescence spectrum, high intensity peaks were respectively seen around 590 nm and around 700 nm, and low intensity peaks were respectively seen around 620 nm and around 650 nm. $Ba_{0.875}Eu_{0.125}F_{2.125}$ (sample in Example 1) emitted a red light having a first light emission peak wavelength of 590 nm, a second light emission peak wavelength of 700 nm, a third light emission peak wavelength of 690 nm, a fourth light emission peak wavelength of 620 nm, and a fifth light emission peak wavelength of 645 nm.

In the excitation spectrum, an excitation peak wavelength was seen in the range of from 200 to 400 nm.

<Formation of a Light Emitting Apparatus>

A UV light emitting device having an AlGaN layer as a light emission layer was first prepared.

Then, $Ba_{0.875}Eu_{0.125}F_{2.125}$ (sample in Example 1) was cut into a circular form as viewed in the plane by dicing with respect to the plane perpendicular to the axial direction, and the resultant circular crystal was further cut according to the size of the second principal surface of the device substrate of the UV light emitting device.

Then, the obtained single crystal plate was bonded to the second principal surface of the device substrate of the UV light emitting device.

Subsequently, the electrode of the UV light emitting device was bonded through a bump to the wiring portion formed on a ceramic substrate.

Thus, the light emitting apparatus shown in FIG. 1 (light emitting apparatus in Example 1) was prepared through the above process.

By conducting electricity through the UV light emitting device from the wiring portion, red light emission with high luminance form the light emitting apparatus was achieved.

Example 2

The light emitting apparatus shown in FIG. 1 (light emitting apparatus in Example 1) was prepared in the same manner as in Example 1.

Then, a Ce:TSAG single crystal plate which is a yellow fluorescent substance was prepared, and cut according to the size of the second principal surface of the device substrate of the UV light emitting device.

Then, the cut Ce:TSAG single crystal plate was bonded to the $Ba_{0.875}Eu_{0.125}F_{2.125}$ (sample in Example 1) single crystal plate in the light emitting apparatus in Example 1.

Subsequently, a $Ce:Lu_2SiO_5$ (LSO) single crystal plate which is a blue fluorescent substance was prepared, and cut according to the size of the Ce:TSAG single crystal plate.

Then, the cut $Ce:Lu_2SiO_5$ (LSO) single crystal plate was bonded to the Ce:TSAG single crystal plate in the light emitting apparatus in Example 1.

Thus, the light emitting apparatus shown in FIG. 6 (light emitting apparatus in Example 2) was prepared through the above process.

By conducting electricity through the UV light emitting device from the wiring portion, white light emission with high luminance from the light emitting apparatus was achieved.

REFERENCE SIGNS LIST 1, 1A, 1B, 1C, 1D, 1E, 1F, 1G, 1H, 1J: Light emitting apparatus
2, 121, 122: UV Photoexcited red light-emitting material
2b, 121b, 122b: Second surface (Light emission surface)
7, 10, 10A: UV Light emitting device
85, 86, 87: UV Photoexcited yellow light-emitting material
95, 96, 97: UV Photoexcited blue light-emitting material

INDUSTRIAL APPLICABILITY

The UV photoexcited red light-emitting material of the present invention can stably emit a red light at high efficiency even when a large current flows through a UV light emitting device to cause the material to emit a light with high luminance due to UV photoexcitation. In the light emitting apparatus of the invention having the UV photoexcited red light-emitting material, the light emitted from the UV light emitting device excites the UV photoexcited red light-emitting material to cause light emission, and the light emitting apparatus uses no binder and can emit a red light or white light with high luminance at high efficiency for a long term. Therefore, the circuit for the light emitting apparatus can be simplified, reducing the cost for production of the apparatus.

The invention claimed is:

1. A light emitting apparatus comprising a plate member comprising a UV photoexcited red light-emitting material, a UV photoexcited yellow light-emitting material arranged in contact with the UV photoexcited red light-emitting material, and a UV photoexcited blue light-emitting material arranged in contact with the UV photoexcited yellow light-emitting material, and a UV light emitting device having a light emission surface, wherein the UV photoexcited red light-emitting material comprises a fluoride single crystal represented by the chemical formula: $M_{1-x}RE_xF_{2+x-w}$, wherein M is at least one metal element belonging to Group 2 of the Periodic Table selected from the group consisting of Be, Mg, Ca, Sr, and Ba, RE is a rare earth element, and the relationships: $0<x\leq0.4$ and $0\leq w\leq0.5$ are satisfied, wherein the UV photoexcited yellow light-emitting material is a cerium-added terbium-candium-aluminum garnet-type single crystal, and wherein the UV photoexcited red light-emitting material is arranged with respect to the UV light emitting device so that one surface of the plate member is opposite to the light emission surface of the UV light emitting device.

2. The light emitting apparatus according to claim 1, wherein M is Ba and RE is Eu.

3. The light emitting apparatus according to claim 1, wherein the relationship: $0.05\leq x\leq0.3$ is satisfied.

4. The light emitting apparatus according to claim 1, wherein the UV light emitting device has a light emission peak wavelength in the range of from 250 to 425 nm.

5. The light emitting apparatus according to claim 1, wherein the UV photoexcited red light-emitting material is arranged in contact with the light emission surface of the UV light emitting device.

6. The light emitting apparatus according to claim 1, wherein the UV photoexcited red light-emitting material is arranged apart from the light emission surface of the UV light emitting device.

7. The light emitting apparatus according to claim 1, wherein the UV photoexcited blue light-emitting material is a Ce:$R_2SiO_5$ single crystal, wherein R is at least one selected from the group consisting of Lu, Y, and Gd.

8. A light emitting apparatus comprising a plate member comprising a UV photoexcited red light-emitting material, a UV photoexcited yellow light-emitting material arranged in contact with the UV photoexcited red light-emitting material, and a UV photoexcited blue light-emitting material arranged in contact with the UV photoexcited yellow light-emitting material, and a UV light emitting device having a light emission surface, wherein the UV photoexcited red light-emitting material comprises a fluoride single crystal represented by the chemical formula: $M_{1-x}RE_xF_{2+x-w}$, wherein M is at least one metal element belonging to Group 2 of the Periodic Table selected from the group consisting of Be, Mg, Ca, Sr, and Ba, and at least one metal element selected from the group of metal elements belonging to Groups 3, 4, 5, 13, and 14 of the Periodic Table, RE is a rare earth element, and the relationships: $0<x\leq0.4$ and $0\leq w\leq0.5$ are satisfied, wherein the UV photoexcited yellow light-emitting material is a cerium-added terbium-scandium-aluminum garnet-type single crystal, and wherein the UV photoexcited red light-emitting material is arranged with respect to the UV light emitting device so that one surface of the plate member is opposite to the light emission surface of the UV light emitting device.

* * * * *